United States Patent
Sasaki

(10) Patent No.: US 12,104,276 B2
(45) Date of Patent: Oct. 1, 2024

(54) GA2O3-BASED SINGLE CRYSTAL SUBSTRATE

(71) Applicant: TAMURA CORPORATION, Tokyo (JP)

(72) Inventor: Kohei Sasaki, Tokyo (JP)

(73) Assignee: TAMURA CORPORATION, Tokyo (JP)

( * ) Notice: Subject to any disclaimer, the term of this patent is extended or adjusted under 35 U.S.C. 154(b) by 729 days.

(21) Appl. No.: 17/236,564

(22) Filed: Apr. 21, 2021

(65) Prior Publication Data

US 2021/0238766 A1    Aug. 5, 2021

Related U.S. Application Data

(63) Continuation of application No. 15/502,008, filed as application No. PCT/JP2015/072334 on Aug. 6, 2015, now abandoned.

(30) Foreign Application Priority Data

Aug. 7, 2014 (JP) ................................. 2014-161760

(51) Int. Cl.
  H01L 21/321   (2006.01)
  C30B 29/16    (2006.01)
  C30B 33/00    (2006.01)

(52) U.S. Cl.
  CPC .............. C30B 29/16 (2013.01); C30B 33/00 (2013.01)

(58) Field of Classification Search
  None
  See application file for complete search history.

(56) References Cited

U.S. PATENT DOCUMENTS

| 6,488,767 B1 * | 12/2002 | Xu ......................... C30B 25/02 |
| | | 117/1 |
| 6,951,695 B2 | 10/2005 | Xu et al. |
| 7,393,411 B2 | 7/2008 | Ichinose et al. |
| 7,713,353 B2 | 5/2010 | Ichinose et al. |

(Continued)

FOREIGN PATENT DOCUMENTS

| CN | 101220244 A | 7/2008 |
| CN | 103781948 A | 5/2014 |

(Continued)

OTHER PUBLICATIONS

European Office Action dated Aug. 31, 2023, received in a corresponding foreign application, namely European Patent Application No. 15 829 189.8, 7 pages.

(Continued)

*Primary Examiner* — Shamim Ahmed
(74) *Attorney, Agent, or Firm* — Scully, Scott, Murphy & Presser, P.C.

(57) ABSTRACT

Provided is a $Ga_2O_3$-based single crystal substrate capable of achieving a high processing yield. A $Ga_2O_3$-based single crystal substrate having a crack density of less than 0.05 cracks/cm can be obtained that has as a principal surface thereof a surface rotated 10-150° from the (100) plane, when a rotation direction from the (100) plane to the (001) plane via the (101) plane is defined as positive, having the [010] axis as the rotation axis.

2 Claims, 15 Drawing Sheets

SUBSTRATE SURFACE AFTER POLISHING

(56) References Cited

U.S. PATENT DOCUMENTS

| | | |
|---|---|---|
| 8,262,796 B2 | 9/2012 | Ichinose et al. |
| 8,747,553 B2 | 6/2014 | Ichinose et al. |
| 9,716,004 B2 | 7/2017 | Sasaki |
| 2002/0185054 A1 | 12/2002 | Xu et al. |
| 2003/0127041 A1 | 7/2003 | Xu et al. |
| 2006/0029832 A1 | 2/2006 | Xu et al. |
| 2006/0150891 A1 | 7/2006 | Ichinose et al. |
| 2008/0265264 A1 | 10/2008 | Ichinose et al. |
| 2010/0229789 A1 | 9/2010 | Ichinose et al. |
| 2012/0304918 A1 | 12/2012 | Ichinose et al. |
| 2014/0217554 A1 | 8/2014 | Sasaki |
| 2014/0239452 A1 | 8/2014 | Sasaki |
| 2015/0380500 A1* | 12/2015 | Masui ............... C30B 15/34 252/512 |
| 2016/0233307 A1 | 8/2016 | Sasaki |

FOREIGN PATENT DOCUMENTS

| | | |
|---|---|---|
| JP | 2004-262684 A | 9/2004 |
| JP | 2004-530306 A | 9/2004 |
| JP | 2008105883 A * | 5/2008 |
| JP | 2010-163350 A | 7/2010 |
| JP | 2013-082587 A | 5/2013 |
| JP | 2013-103863 A | 5/2013 |
| JP | 2013-177256 A | 9/2013 |
| JP | 2014-086458 A | 5/2014 |
| WO | 2013/035464 A1 | 3/2013 |
| WO | 2013/035472 A1 | 3/2013 |

OTHER PUBLICATIONS

International Search Report dated Oct. 27, 2015 issued in PCT/JP2015/072334.
Ruse, G.F. et al., "Growth of Neodymium Gallium Oxide Crystals", Journal of Crystal Growth, vol. 29, No. 3, Jul. 1, 1975, pp. 305-308.
Partial Supplementary European Search Report dated Dec. 22, 2017 in European Patent Application No. 15 82 9189.8.
Extended European Search Report dated Apr. 3, 2018 received from the EPO in related EP 15 82 9189.8.
Chinese Office Action dated Jul. 31, 2018 received in a corresponding foreign application with English-language translation.
Taiwanese Office Action dated Apr. 8, 2019 received in a corresponding foreign application with English-language translation.
Sasaki, K., et al., MBE grown Ga2O3 and its power device applications, Journal of Crystal Growth, 2013, pp. 591-595, 378.
European Office Action dated Oct. 29, 2020 received in a corresponding foreign application, 12 pages.
Chinese Office Action dated Apr. 20, 2021, received in a corresponding foreign application with English-language translation, 10 pages.
Chinese Office Action dated Jan. 12, 2022 received in a corresponding foreign application with English-language translation, 9 pages.

* cited by examiner 1.2mm

SUBSTRATE SURFACE AFTER POLISHING

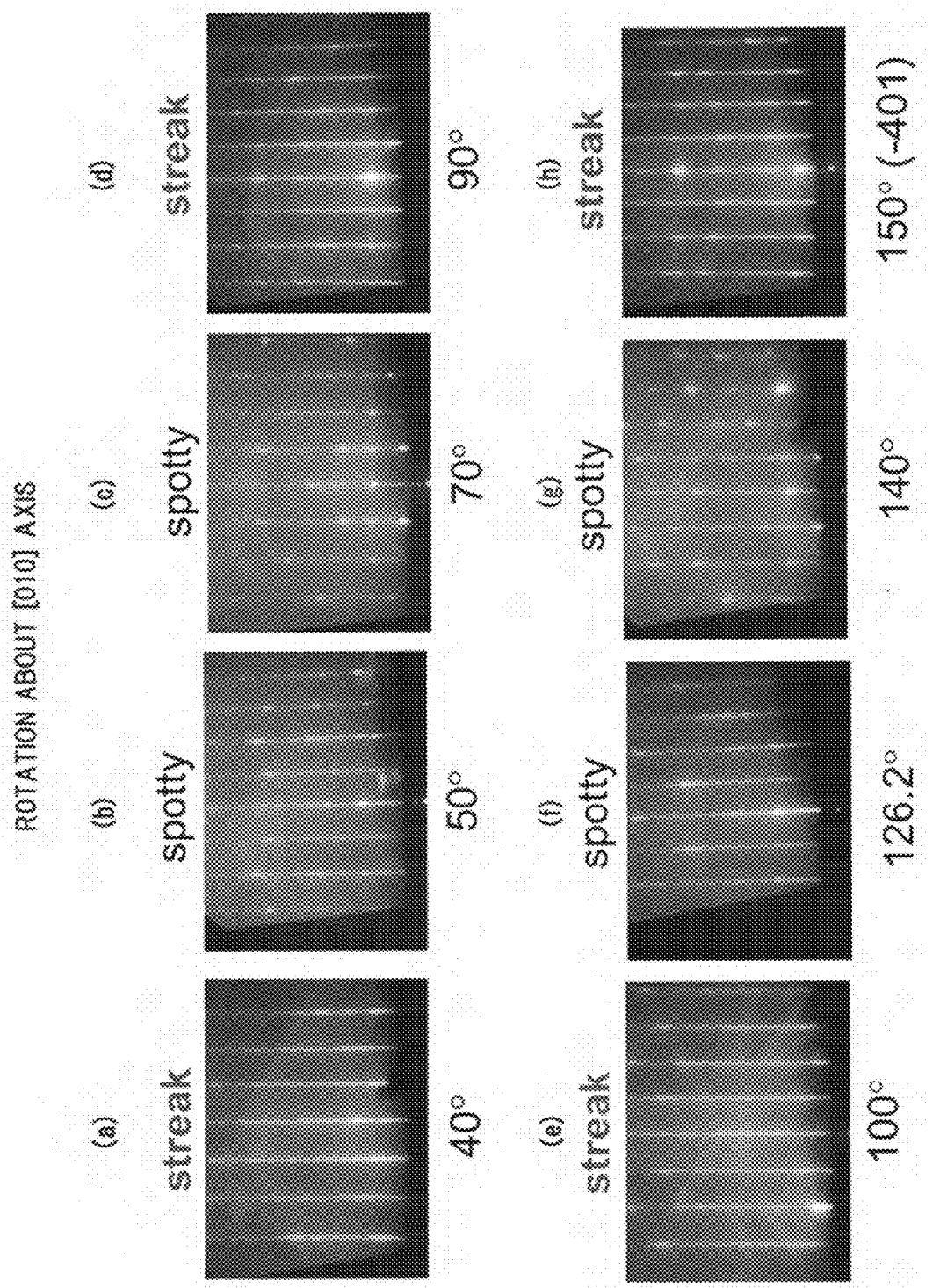

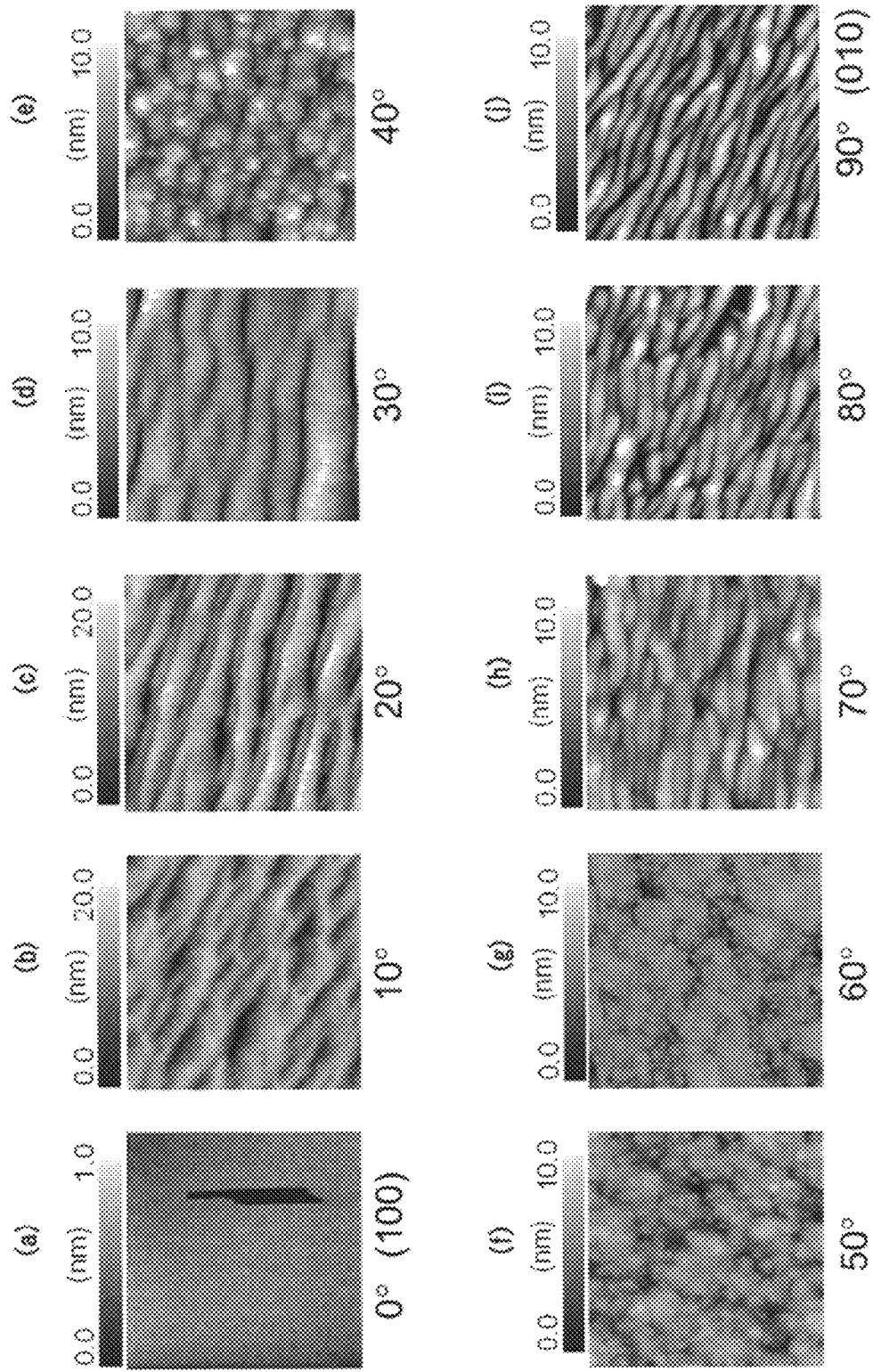

GA2O3-BASED SINGLE CRYSTAL SUBSTRATE

The present application is a continuation application of U.S. patent application Ser. No. 15/502,008, filed Feb. 6, 2017, which is a national phase application of PCT/JP 2015/072334, filed Aug. 6, 2015, which claims priority to Japanese Patent Application No. 2014-161760, filed Aug. 7, 2014, the entire contents of each is incorporated herein by reference for any purpose.

TECHNICAL FIELD

The invention relates to a $Ga_2O_3$-based single crystal substrate.

BACKGROUND ART

A $\beta$-$Ga_2O_3$-based substrate which has as a principal surface a plane rotated not less than 50° and not more than 90° from the (100) plane has been proposed (see, e.g., PTL 1).

In PTL 1, examples of the plane rotated not less than 50° and not more than 90° from the (100) plane include (010), (001), (−201), (101) and (310) planes.

CITATION LIST

Patent Literature

[PTL 1]
WO 2013/035464

SUMMARY OF INVENTION

Technical Problem

It is an object of the invention to provide a $Ga_2O_3$-based single crystal substrate that can have a high processing yield.

As a result of diligent research on the $Ga_2O_3$-based single crystal substrate, the inventor found that the above object can be attained by employing a specific plane direction as a crystal growth principal surface.

The above object can be achieved by the respective inventions defined by [1] to [4] below.

A $Ga_2O_3$-based single crystal substrate, comprising as a principal surface a plane rotated 10 to 150° from a (100) plane about a [010] axis where a direction of rotation from the (100) plane to the (001) plane via a (101) plane is defined as positive, wherein the substrate has a crack density of less than 0.05 cracks/cm.

A $Ga_2O_3$-based single crystal substrate, comprising as a principal surface a plane rotated 10 to 70° or 100 to 150° from a (100) plane about a [010] axis where a direction of rotation from the (100) plane to a (001) plane via a (101) plane is defined as positive, wherein the substrate has a crack density of less than 0.05 cracks/cm and no latent scratch.

A $Ga_2O_3$-based single crystal substrate, comprising as a principal surface a plane rotated 10 to 90° from a (100) plane about a [001] axis, wherein the substrate has a crack density of less than 0.05 cracks/cm.

A $Ga_2O_3$-based single crystal substrate, comprising as a principal surface a plane rotated 10 to 90° from a (100) plane about a [001] axis, wherein the substrate has a crack density of less than 0.05 cracks/cm and no latent scratch.

Advantageous Effects of the Invention

According to the invention, a $Ga_2O_3$-based single crystal substrate can be provided that has a high processing yield.

BRIEF DESCRIPTION OF DRAWINGS

FIG. 9 is RHEED images from surfaces of epitaxial films grown on surfaces of $Ga_2O_3$ single crystal substrates which are planes rotated about [010] axis (Embodiment 3).

FIG. 15 is 1 μm×1 μm AFM images taken from surfaces of epitaxial films grown on principal surfaces of $Ga_2O_3$ single crystal substrates which are planes rotated about [001] axis (Embodiment 4).

DESCRIPTION OF EMBODIMENTS

Figure 1:
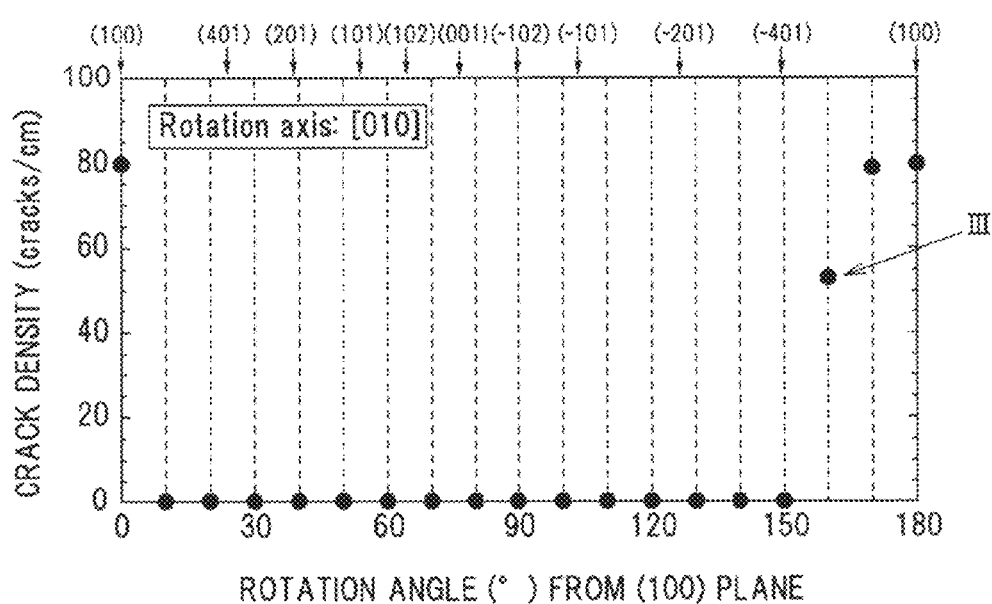
FIG. 1 is a diagram illustrating a relation between a rotation angle of principal surface of $Ga_2O_3$ single crystal substrate from the (100) plane about the [010] axis and a crack density on the principal surface (Embodiment 1).

Preferred examples of the invention will be specifically described in Embodiments below with reference to the drawings.

Embodiment 1

$Ga_2O_3$-based single crystal substrates have the following problems (1) and (2).
(1) $Ga_2O_3$-based single crystal substrates have high cleavage along the (100) plane, and parting or cracks due to the cleavage are likely to occur when processing $Ga_2O_3$-based single crystal substrates. Since parting or cracks are likely to occur during substrate processing, it is difficult to obtain large $Ga_2O_3$-based single crystal substrates.
(2) The cleavage along the (100) plane is high. Therefore, there is a problem that $Ga_2O_3$-based single crystal substrates are more likely to break during device manufacturing when an angle of the (100) plane relative to the substrate surface (principal surface) is closer to 90°, especially when the angle between the (100) plane and the principal surface is not less than 45°.

Therefore, aiming to obtain a $Ga_2O_3$-based single crystal substrate which is less likely to crack or break, plural $Ga_2O_3$ single crystal substrates having principal surfaces with different plane orientations were formed in Embodiment 1 to evaluate a relation between the plane orientation of the principal surface and the crack generation rate.

A $Ga_2O_3$-based single crystal substrate is a substrate formed of a β-$(Ga_xIn_yAl_z)_2O_3$ single crystal (where 0<x≤1, 0≤y<1, 0≤z<1, x+y+z=1) such as β-$Ga_2O_3$ single crystal.
(Manufacturing of $Ga_2O_3$ Single Crystal Substrate)

$Ga_2O_3$ single crystal substrates having principal surfaces being planes rotated 0 to 170° from the (100) plane about the [010] axis and $Ga_2O_3$ single crystal substrates having principal surfaces being planes rotated 10 to 90° from the (100) plane about the [001] axis were cut out from a $Ga_2O_3$ single crystal and were then processed into 10 mm square plates with a thickness of 1 mm. Twenty $Ga_2O_3$ single crystal substrates were made for each rotation angle. The 10 mm square $Ga_2O_3$ single crystal substrates with the [010] axis as the rotation axis have one side parallel to the [010] direction. Here, an angle rotated about the [010] axis in a direction from the (100) plane to the (001) plane via the (101) plane is defined as s positive angular value. Meanwhile, the 10 mm square $Ga_2O_3$ single crystal substrates with the [001] axis as the rotation axis have one side parallel to the [001] direction.

Next, the $Ga_2O_3$ single crystal substrates were ground to a thickness of about 0.8 mm by a grinding machine with a 1000 grit grinding wheel. The grinding rate is about 6 μm/min. After the grinding, surface polishing was performed to remove a thickness of 20 μm while spraying diamond abrasive grains.

Lastly, a surface layer of about 10 μm was polished away by CMP (Chemical mechanical planarization). After the CMP process, the substrates were subjected to organic cleaning using an organic solvent (acetone, methanol, IPA, ethanol), immersion cleaning using HF and immersion cleaning using an acid obtained by mixing $H_2SO_4$, $H_2O_2$ and $H_2O$ at 4:1:1, were rinsed with ultrapure water and were then dried by blowing nitrogen.
(Evaluation of Crack Density of $Ga_2O_3$ Single Crystal Substrate)

Figure 2:
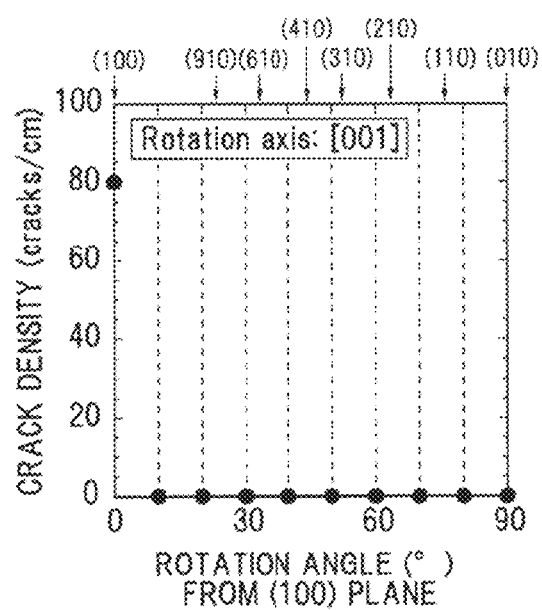
FIG. 2 is a diagram illustrating a relation between a rotation angle of principal surface of $Ga_2O_3$ single crystal substrate from the (100) plane about the [001] axis and a crack density on the principal surface (Embodiment 1).

Referring to FIGS. 1 and 2, FIG. 1 shows a relation between a rotation angle of principal surface of $Ga_2O_3$ single crystal substrate from the (100) plane about the [010] axis and a crack density on the principal surface after the CMP process, and FIG. 2 shows a relation between a rotation angle of principal surface of $Ga_2O_3$ single crystal substrate from the (100) plane about the [001] axis and a crack density on the principal surface after the CMP process. The crack density of $Ga_2O_3$ single crystal substrate at each rotation angle shown in FIGS. 1 and 2 is an average crack density of twenty $Ga_2O_3$ single crystal substrates.

Where the longest of the straight lines on the principal surface of the $Ga_2O_3$ single crystal substrate which are perpendicular to the [010] direction is defined as a reference line, the number of cracks extending along the [010] direction and intersecting the reference line is divided by the length of the reference line and the obtained value is defined as the crack density on the $Ga_2O_3$ single crystal substrate principal surface rotated about the [010] axis. For example, when the $Ga_2O_3$ single crystal substrate has a circular shape, the reference line is a straight line which passes through the center of the substrate and extends in a direction perpendicular to the [010] direction, and the length of the reference line corresponds to the diameter of the circular $Ga_2O_3$ single crystal substrate.

Meanwhile, where the longest of the straight lines on the principal surface of the $Ga_2O_3$ single crystal substrate which are perpendicular to the [001] direction is defined as a reference line, the number of cracks extending along the [001] direction and intersecting the reference line is divided by the length of the reference line and the obtained value is defined as the crack density of the $Ga_2O_3$ single crystal substrate principal surface rotated about the [001] axis. For example, when the $Ga_2O_3$ single crystal substrate has a circular shape, the reference line is a straight line which passes through the center of the substrate and extends in a direction perpendicular to the [001] direction, and the length of the reference line corresponds to the diameter of the circular $Ga_2O_3$ single crystal substrate.

As shown in FIGS. 1 and 2, cracks did not occur on the [010]-axis 10°-to-150°-rotation substrates of which principal surfaces are planes rotated 10 to 150° from the (100) plane about the [010] axis, and on the [001]-axis 10°-to-90°-rotation substrates of which principal surfaces are planes rotated 10 to 90° from the (100) plane about the [001] axis.

Based on the fact that cracks do not occur on twenty 10 mm square substrates with one side parallel to the [010] direction, it is presumed that cracks do not occur on a 10 mm×200 mm rectangular substrate with a lateral direction parallel to the [010] direction. The number of cracks on the 10 mm×200 mm rectangular substrate with a lateral direction parallel to the [010] direction is less than one, and the crack density is thus less than 0.05 cracks/cm.

Likewise, based on the fact that cracks do not occur on twenty 10 mm square substrates with one side parallel to the [001] direction, it is presumed that cracks do not occur on a 10 mm×200 mm rectangular substrate with a lateral direction parallel to the [001] direction. The number of cracks on the 10 mm×200 mm rectangular substrate with a lateral direction parallel to the [001] direction is less than one, and the crack density is thus less than 0.05 cracks/cm.

In other words, the [010]-axis 10°-to-150°-rotation substrates and the [001]-axis 10°-to-90°-rotation substrates have a crack density of less than 0.05 cracks/cm.

On the other hand, many deep linear defects (cracks) extending in the [010] direction occurred in the [010]-axis 160°-to-180°-rotation substrates of which principal surfaces are planes rotated 160 to 180° from the (100) plane about the [010] axis. These cracks occurred due to polishing using diamond abrasive grains and were not eliminated by the subsequent CMP process.

Figure 3:
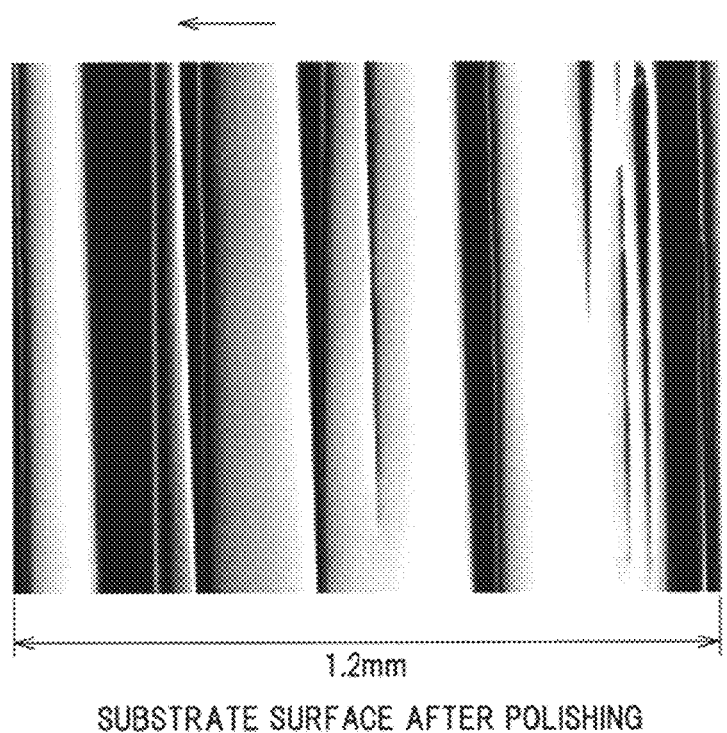
FIG. 3 is an optical micrograph showing a CMP-processed principal surface of a $Ga_2O_3$ single crystal substrate in which the principal surface is a plane rotated 160° from the (100) plane about the [010] axis (Embodiment 1).

FIG. 3 is an optical micrograph showing a CMP-processed principal surface of a $Ga_2O_3$ single crystal substrate in which the principal surface is a plane rotated 160° from the (100) plane about the [010] axis (the value measured on this surface is pointed by an arrow III in FIG. 1). The black portions in the photograph are deep grooves caused by cracks and the white portion in the photograph is the polished surface. The arrow in FIG. 3 indicates a direction perpendicular to the [010] direction.

The crack density was 53 cracks/cm on the [010]-axis 160°-rotation substrate and 79 cracks/cm on the [010]-axis 170°-rotation substrate. A crack-free region on the substrate with the crack density of 53 cracks/cm had a width of about 189 μm in a direction perpendicular to the [010] direction.

In the meantime, in some cases, the substrates were flat when observed under the optical microscope and atomic force microscope after surface polishing, but still had residual polishing damages. When a homoepitaxial film is grown on such residual polishing damages (latent scratches), the latent scratches emerge as surface defects.

Figure 4:
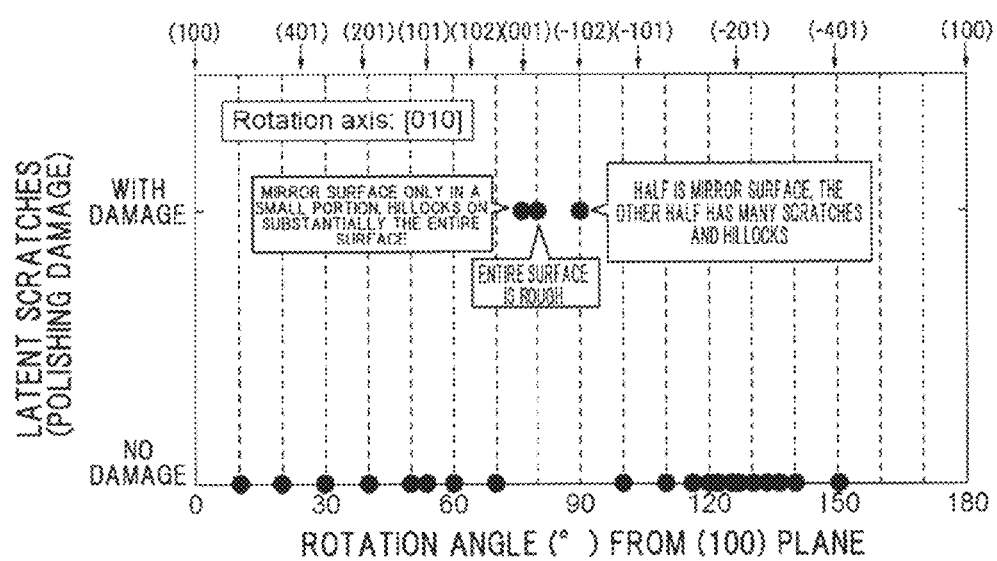
FIG. 4 is a diagram illustrating a relation between a rotation angle of principal surface of $Ga_2O_3$ single crystal substrate from the (100) plane about the [010] axis and latent scratches (polishing damage) (Embodiment 1).

To assess the presence of latent scratches, films were homoepitaxially grown by MBE. The growth temperature was 750° C. and the growth time was 30 minutes. FIG. 4 shows a relation between a rotation angle of principal surface of $Ga_2O_3$ single crystal substrate from the (100) plane about the [010] axis and the presence of latent scratches (polishing damage).

As obvious from FIG. 4, the homoepitaxial film on the [010]-axis 90°-rotation substrate had a surface with half mirror surface and the other half covered with scratches and hillocks due to polishing damage. The surface of the homoepitaxial film on the [010]-axis 80°-rotation substrate was entirely covered with similar hillocks. The surface of the homoepitaxial film on the [010]-axis 76.3°-rotation substrate was substantially entirely covered with similar hillocks, with only a small portion of mirror surface. This shows that polishing damage is likely to remain on a surface rotated in a range of 76.3 to 90° about the [010] axis.

Meanwhile, any surface defect due to latent scratch was not observed on the entire surface of the [001]-axis 10°-to-90°-rotation substrates of which principal surfaces are planes rotated 10 to 90° from the (100) plane about the [001] axis.

From the above, it is understood that occurrence of cracks and latent scratches during surface polishing is reduced when using a plane rotated 10 to 70° about the [010] axis, a plane rotated 100 to 150° about the [010] axis or a plane rotated 10 to 90° about the [001] axis.

Although the $Ga_2O_3$ single crystal substrate was evaluated in Embodiment 1, similar evaluation results to the above are also obtained from evaluation of $Ga_2O_3$-based single crystal substrates other than the $Ga_2O_3$ single crystal substrate.

It is obvious from the above description that the following $Ga_2O_3$-based single crystal substrates are obtained.

A $Ga_2O_3$-based single crystal substrate, including as a principal surface a plane rotated 10 to 150° from a (100) plane about a [010] axis where a direction of rotation from the (100) plane to a (001) plane via a (101) plane is defined as positive, wherein the substrate has a crack density of less than 0.05 cracks/cm.

A $Ga_2O_3$-based single crystal substrate, including as a principal surface a plane rotated 10 to 70° or 100 to 150° from a (100) plane about a [010] axis where a direction of rotation from the (100) plane to a (001) plane via a (101) plane is defined as positive, wherein the substrate has a crack density of less than 0.05 cracks/cm and no latent scratch.

A $Ga_2O_3$-based single crystal substrate, including as a principal surface a plane rotated 10 to 90° from a (100) plane about a [001] axis, wherein the substrate has a crack density of less than 0.05 cracks/cm.

A $Ga_2O_3$-based single crystal substrate, including as a principal surface a plane rotated 10 to 90° from a (100) plane about a [001] axis, wherein the substrate has a crack density of less than 0.05 cracks/cm and no latent scratch.

Effects of Embodiment 1

In Embodiment 1, the following effects are obtained in addition to the effects described above.

It is possible to significantly reduce cracks, latent scratches or parting during substrate processing, thereby improving a manufacturing yield of a large $Ga_2O_3$-based single crystal substrate. In detail, by using a plane rotated 100 to 150° from the (100) plane about the [010] axis or a plane rotated 10 to 90° from the (100) plane about the [001] axis as a principal surface, it is possible to manufacture a large $Ga_2O_3$-based single crystal substrate having a width of about not less than 0.2 mm and not more than 20 cm.

Embodiment 2

When a principal surface of the $Ga_2O_3$-based single crystal substrate is the (100) plane, there is a problem that raw materials supplied to grow a $Ga_2O_3$ crystal film on the principal surface is likely to re-evaporate, resulting in a very slow growth rate of the $Ga_2O_3$ crystal film and low mass productivity.

Therefore, aiming to obtain a $Ga_2O_3$-based single crystal substrate allowing a $Ga_2O_3$ crystal film to grow on the principal surface at a high growth rate, $Ga_2O_3$ crystal films were respectively grown on plural $Ga_2O_3$ single crystal substrates having principal surfaces with different plane orientations in Embodiment 2 to evaluate a relation between the plane orientation of the principal surface and the growth rate of the $Ga_2O_3$ crystal film.

(Manufacturing of $Ga_2O_3$ Single Crystal Substrate and $Ga_2O_3$ Crystal Film)

$Ga_2O_3$ single crystal substrates having principal surfaces being planes rotated 0 to 150° from the (100) plane about the [010] axis and $Ga_2O_3$ single crystal substrates having principal surfaces being planes rotated 10 to 90° from the (100) plane about the [001] axis were prepared, where the direction of rotation from the (100) plane to the (001) plane via the (101) plane gives positive angular values. The $Ga_2O_3$ single crystal substrates are doped with Sn and are n-type $Ga_2O_3$ single crystal substrates.

The surfaces of the $Ga_2O_3$ single crystal substrates were treated by a grinding/polishing process and the CMP process was performed after the grinding/polishing process. After the CMP process, the substrates were subjected to organic cleaning using an organic solvent (acetone, methanol, IPA, ethanol), immersion cleaning using HF and immersion cleaning using an acid obtained by mixing $H_2SO_4$, $H_2O_2$ and H$_2$O at 4:1:1, were rinsed with ultrapure water, were then dried by blowing nitrogen, and were thereby brought into a substrate condition allowing for epitaxial growth. Ga$_2$O$_3$ crystal films were epitaxially grown on these substrates by MBE. The growth temperature was 750° C. and the growth time was 30 minutes.

(Evaluation of Growth Rate of Ga$_2$O$_3$ Single Crystal Film)

Figure 5:
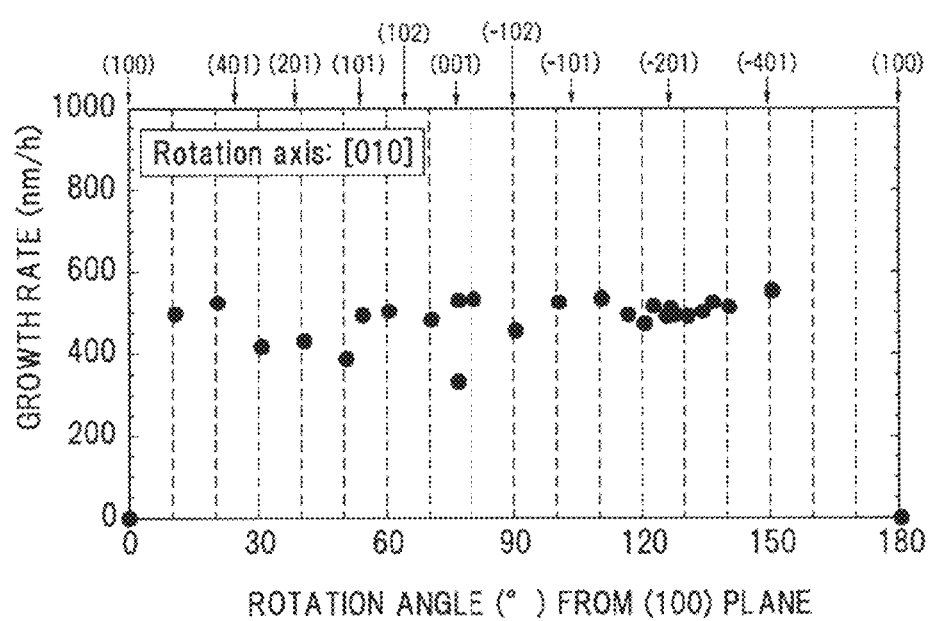
FIG. 5 is a diagram illustrating a relation between a rotation angle of principal surface of $Ga_2O_3$ single crystal substrate from the (100) plane when rotated about the [010] axis and a growth rate of an epitaxial film (Embodiment 2).
Figure 6:
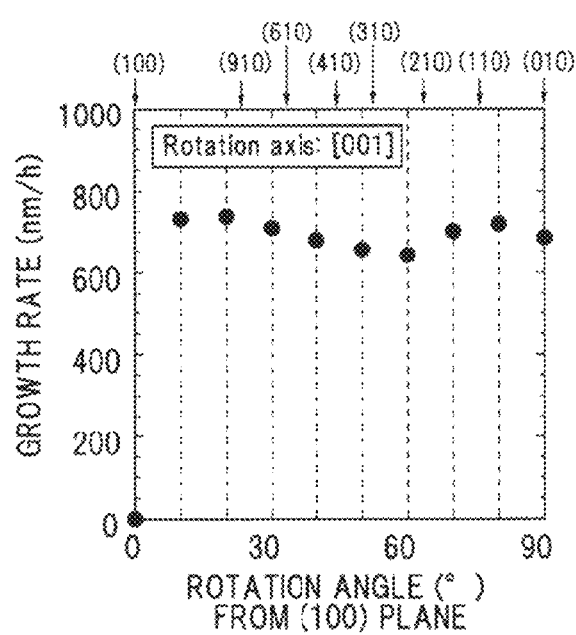
FIG. 6 is a diagram illustrating a relation between a rotation angle of principal surface of $Ga_2O_3$ single crystal substrate from the (100) plane about the [001] axis and a growth rate of an epitaxial film (Embodiment 2).

FIGS. 5 and 6 show the evaluation results of the growth rate of the Ga$_2$O$_3$ crystal films on principal surfaces of the Ga$_2$O$_3$ single crystal substrates which are planes rotated from the (100) plane about the [010] axis, and the evaluation results of the growth rate of the Ga$_2$O$_3$ crystal films on principal surfaces of the Ga$_2$O$_3$ single crystal substrates which are planes rotated from the (100) plane about the [001] axis.

FIG. 5 shows a relation between a rotation angle (°) of principal surface of Ga$_2$O$_3$ single crystal substrate from the (100) plane about the [010] axis and the growth rate (nm/h) of the Ga$_2$O$_3$ crystal film. FIG. 6 shows a relation between a rotation angle (°) of principal surface of Ga$_2$O$_3$ single crystal substrate from the (100) plane about the [001] axis and the growth rate of the Ga$_2$O$_3$ crystal film.

In FIG. 5, the growth rate is about 500 nm/h on the [010]-axis 10°-rotation plane which is a plane rotated 10° from the (100) plane about the [010] axis, while the growth rate is not more than 10 nm/h (below the lower limit of measurement) on the (100) plane. This shows that the growth rate of the Ga$_2$O$_3$ crystal film can be increased by at least not less than 50 times by 10° rotation from the (100) plane.

FIG. 5 also shows that the growth rate of the Ga$_2$O$_3$ crystal film, when the principal surface is a plane rotated in a range of not less than 10° and not more than 150° from the (100) plane about the [010] axis, is significantly higher than when the principal surface is the (100) plane.

FIG. 6 shows that the growth rate of the Ga$_2$O$_3$ crystal film, when the principal surface is a plane rotated in a range of not less than 10° and not more than 90° from the (100) plane about the [001] axis, is significantly higher than when the principal surface is the (100) plane.

Meanwhile, the cleavage along the (100) plane is high and substrates are likely to break during device manufacturing when the angle formed between the (100) plane and the principal surface is not less than 45°. For this reason, the principal surface is preferably a plane rotated less than 45° from the (100) plane.

Therefore, to increase the growth rate of the Ga$_2$O$_3$ crystal film and to prevent the substrate from breaking during device manufacturing, the principal surface should be a plane rotated not less than 10° and less than 45° from the (100) plane about the [010] axis or a plane rotated not less than 10° and less than 45° from the (100) plane about the [001] axis.

In addition, it is possible to increase the growth rate of the Ga$_2$O$_3$ crystal film, to prevent the substrate from breaking during device manufacturing, and also to reduce the crack density on the principal surface down to less than 0.05 cracks/cm when growing the Ga$_2$O$_3$ crystal film on the principal surface which is a plane rotated not less than 10° and less than 45° or rotated more than 135° and not more than 150° from the (100) plane about the [010] axis or a surface rotated not less than 10° and less than 45° from the (100) plane about the [001] axis, where a direction of rotation from the (100) plane to the (001) plane via the (101) plane is defined as positive.

The mains surfaces of the substrates used in this study are planes rotated about the axis and the [001] axis which are two orthogonal axes, and the results obtained with the two orthogonal axes are similar. Based on this, it is easily predicted that a similar result will be obtained even when rotated about an axis between the two axes. In other words, when the principal surface is a plane rotated from the (100) plane, the higher growth rate of the Ga$_2$O$_3$ crystal film than that grown on the (100) plane can be obtained regardless of the direction of rotation axis, as long as the rotation angle is not less than 10° and less than 45°. Therefore, it is possible to increase the growth rate of the Ga$_2$O$_3$ crystal film and to prevent the substrate from breaking during device manufacturing when the principal surface is a plane rotated not less than 10° and less than 45° from the (100) plane.

In comparison between FIG. 5 and FIG. 6, the growth rate is generally higher on the [001]-axis rotation plane which is a plane rotated from the (100) plane about the [001] axis, than on the [010]-axis rotation plane which is a plane rotated from the (100) plane about the [010] axis. For example, the growth rate is, e.g., about 500 nm/h on the [010]-axis 10°-rotation plane and is about 730 nm/h on the [001]-axis 10°-rotation plane which is about 1.5 time higher. This indicates that the growth rate increases when components of the (010) plane emerge on the principal surface. Thus, it was expected that the growth rate would be increased by inclining the [010]-axis rotation plane in the [010] direction so that the components of the (010) plane emerge on the principal surface.

Figure 7:
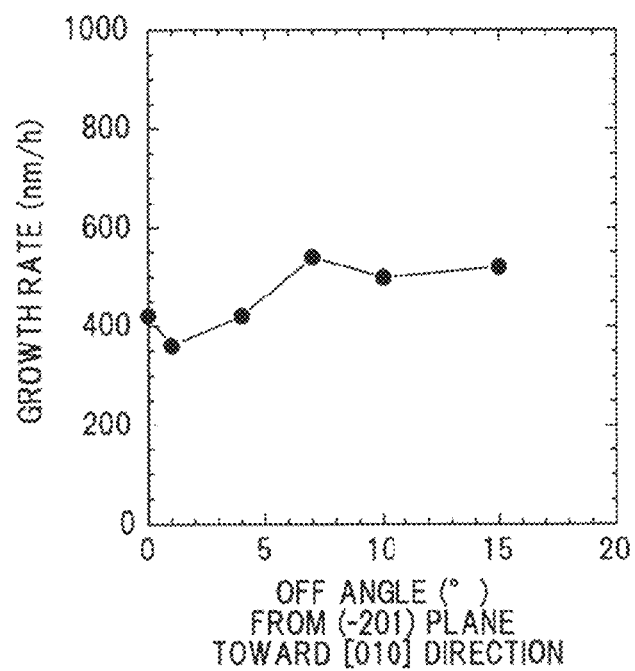
FIG. 7 is a diagram illustrating a relation between an inclination angle of $Ga_2O_3$ single crystal substrate from a (−201) plane in the [010] direction and a growth rate of an epitaxial film (Embodiment 2).

FIG. 7 shows a relation between an inclination angle (off angle) from a [010]-axis 126.2°-rotation=(−201) plane in the [010] direction and a growth rate of the epitaxial film. As obvious from FIG. 7, the growth rate increases with an increase in the inclination angle of the Ga$_2$O$_3$ single crystal substrate from the (−201) plane in the [010] direction and is saturated at an off angle of 7°.

This result shows that inclination in the [010] direction at an off angle is effective to increase the growth rate (raw material utilization efficiency) on the [010]-axis rotation (−201) plane. In addition, the increase in the growth rate reaches its peak at 7°. Therefore, inclination of not less than 7° eliminates the off angle dependence of the growth rate, thereby prevents uneven growth rate caused by variation in the off angle of the substrate, and is thus effective to improve stability of production. For this reason, the off angle is preferably not less than 7°. The similar results are obtained when [010]-axis rotation planes other than the [010]-axis rotation (−201) plane are inclined in the [010] direction.

Although the Ga$_2$O$_3$ single crystal substrate was evaluated in Embodiment 2, similar evaluation results to the above are also obtained from evaluation of Ga$_2$O$_3$-based single crystal substrates other than the Ga$_2$O$_3$ single crystal substrate. In addition, similar evaluation results are obtained also when (Ga$_x$In$_y$Al$_z$)$_2$O$_3$ crystal films (0<x≤1, 0≤y<1, 0≤z<1, x+y+z=1) are grown in place of the Ga$_2$O$_3$ crystal film.

It is obvious from the above description that the following Ga$_2$O$_3$-based single crystal substrates are obtained.

A Ga$_2$O$_3$-based single crystal substrate, including as a growth face a plane rotated not less than 10° and less than 45° from a (100) plane.

A Ga$_2$O$_3$-based single crystal substrate, including as a growth face a plane rotated not less than 10° and less than 45° from a (100) plane about a [010] axis.

A Ga$_2$O$_3$-based single crystal substrate, including as a growth face a plane rotated not less than 10° and less than 45° or rotated more than 135° and not more than 150°, from a (100) plane about a [010] axis where a direction of rotation from the (100) plane to a (001) plane via a (101) plane is defined as positive.

A $Ga_2O_3$-based single crystal substrate, including as a growth face a plane rotated not less than 10° and less than 45° from a (100) plane about a [001] axis.

Effects of Embodiment 2

In Embodiment 2, the following effects are obtained in addition to the same effects as those described in Embodiment 1.

It is possible to reduce re-evaporation of the supplied raw materials and thereby to improve raw material supply efficiency during epitaxial growth. Furthermore, it is possible to suppress a decrease in device production yield. It is also possible to prevent the substrate from, e.g., breaking during device manufacturing.

Embodiment 3

There are the following problems (1) and (2) when forming a $Ga_2O_3$ crystal film on a $Ga_2O_3$-based single crystal substrate.

(1) When a $Ga_2O_3$ crystal film is grown on a $Ga_2O_3$ single crystal substrate having a (010) plane, a (001) plane or a (−201) plane as a principal surface, there is no problem with the growth rate, but crystallinity distribution within a surface of the $Ga_2O_3$ crystal film is less uniform and a non-monocrystalline portion is partially formed. Crystallinity within a surface of the $Ga_2O_3$ crystal film, when grown on a $Ga_2O_3$ single crystal substrate of which principal surface is a plane rotated from the (100) plane about the [001] axis, is not known. If a device is formed on the non-monocrystalline portion, the crystal grain boundary may serve as a leakage current path, causing a decrease in device performance in off-state.

(2) When a $Ga_2O_3$ crystal film is grown on a $Ga_2O_3$ single crystal substrate having a (001) plane as a principal surface, there is no problem with the growth rate and it is easy to obtain a flat $Ga_2O_3$ crystal film. However, the cleavage along the (001) plane is high in the same manner as along the (100) plane, which makes difficult to polish the substrate surface, and parting, etc., due to cleavage may occur during device manufacturing.

Therefore, aiming to obtain a $Ga_2O_3$-based single crystal substrate on which a $Ga_2O_3$ crystal film with highly uniform crystallinity distribution within a surface can be grown, plural $Ga_2O_3$ single crystal substrates having principal surfaces with different plane orientations were formed in Embodiment 3 to evaluate a relation between the plane orientation of the principal surface and quality of the $Ga_2O_3$ crystal film.

The relation between the plane orientation of principal surface of $Ga_2O_3$ single crystal substrate and the quality of the $Ga_2O_3$ crystal film grown on the principal surface will be described in detail below in reference to FIGS. 8 to 10.

(Manufacturing of $Ga_2O_3$ Single Crystal Substrate and $Ga_2O_3$ Crystal Film)

$Ga_2O_3$ single crystal substrates having principal surfaces being planes rotated 0 to 150° from the (100) plane about the [010] axis and $Ga_2O_3$ single crystal substrates having principal surfaces being planes rotated 10 to 90° from the (100) plane about the [001] axis were prepared, where the direction of rotation from the (100) plane to the (001) plane via the (101) plane gives positive angular values. The $Ga_2O_3$ single crystal substrates are doped with Sn and are n-type $Ga_2O_3$ single crystal substrates.

The surfaces of the $Ga_2O_3$ single crystal substrates were treated by a grinding/polishing process and the CMP process was performed after the grinding/polishing process. After the CMP process, the substrates were subjected to organic cleaning using an organic solvent (acetone, methanol, IPA, ethanol), immersion cleaning using HF and immersion cleaning using an acid obtained by mixing $H_2SO_4$, $H_2O_2$ and $H_2O$ at 4:1:1, were rinsed with ultrapure water, were then dried by blowing nitrogen, and were thereby brought into a substrate condition allowing for epitaxial growth. $Ga_2O_3$ crystal films were epitaxially grown on these substrates by MBE. The growth temperature was 750° C. and the growth time was 30 minutes. The thickness of the $Ga_2O_3$ crystal film was about 300 nm.

(Preventing Crystal with a Different Orientation from Substrate Form being Mixed)

Figure 8A:
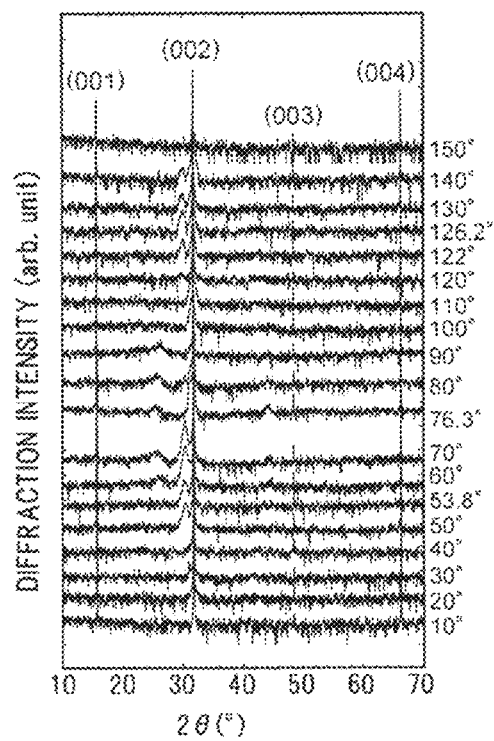
FIG. 8A is a diagram illustrating the X-ray diffraction measurement result after epitaxial growth is performed on the $Ga_2O_3$ single crystal substrate (Embodiment 3).
Figure 8B:
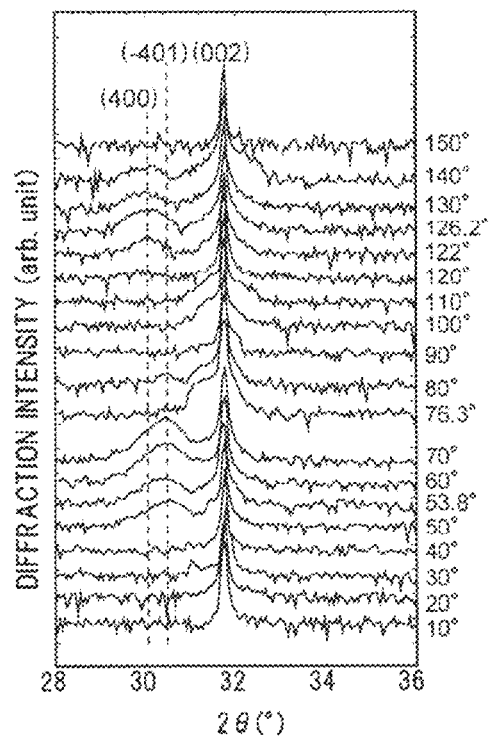
FIG. 8B is an enlarged view showing diffraction around the (002) plane in FIG. 8A (Embodiment 3).

FIG. 8A shows X-ray diffraction spectra obtained by X-ray diffraction measurement, (001) asymmetric 2θ-ω scan, using XRD (X-Ray-Diffractometer). FIG. 8B is an enlarged view showing diffraction around (002) in the X-ray diffraction spectra of FIG. 8A.

The horizontal axis in the drawings indicates an angle 2θ (°) formed between an X-ray incident direction and a reflection direction, and the vertical axis on the left side of the drawings indicates X-ray diffraction intensity (arbitrary unit). The numerical values on the right side of the X-ray diffraction spectra indicate rotation angles of principal surface of $Ga_2O_3$ single crystal substrate from the (100) plane about the [010] axis.

In FIGS. 8A and 8B, diffraction peaks for crystals with different orientations from the substrate are present on the low angle side. The diffraction peaks at around 2θ=26° and 46.5° are due to diffraction from a sample stage of the X-ray diffractometer.

It was found that a (−401)-orient crystal was mixed on the (001) plane of the $Ga_2O_3$ crystal films grown on the [010]-axis 50°-to-80°-rotation planes. On the other hand, it was found that a (400)-orient crystal was mixed on the (001) plane of the $Ga_2O_3$ crystal films grown on the [010]-axis 120°-to-140°-rotation planes.

FIG. 9 is RHEED (Reflective High-Energy Electron Diffraction) images from surfaces of the $Ga_2O_3$ crystal films grown on typical planes rotated 40°, 50°, 70°, 90°, 100°, 126.2°, 140° and 150° about [010] axis.

As obvious from FIG. 9, the $Ga_2O_3$ crystal films grown on the planes rotated 50°, 70°, 126.2° and 140° about [010] axis, in which a mixture of a crystal with a different orientation from the substrate was observed by the XRD evaluation, have a spotty pattern in the RHEED images. It is considered that the atomic arrangement is disordered by mixture of the crystal with a different orientation from the substrate in the $Ga_2O_3$ crystal films, and the spotty pattern is thereby formed.

On the other hand, the $Ga_2O_3$ crystal films grown on the planes rotated 40°, 90°, 100° and 150° about [010] axis and not containing a crystal with a different orientation from the substrate have a streaky pattern in the RHEED images. The streaky pattern indicates that a $Ga_2O_3$ single crystal film is obtained.

Figure 10:
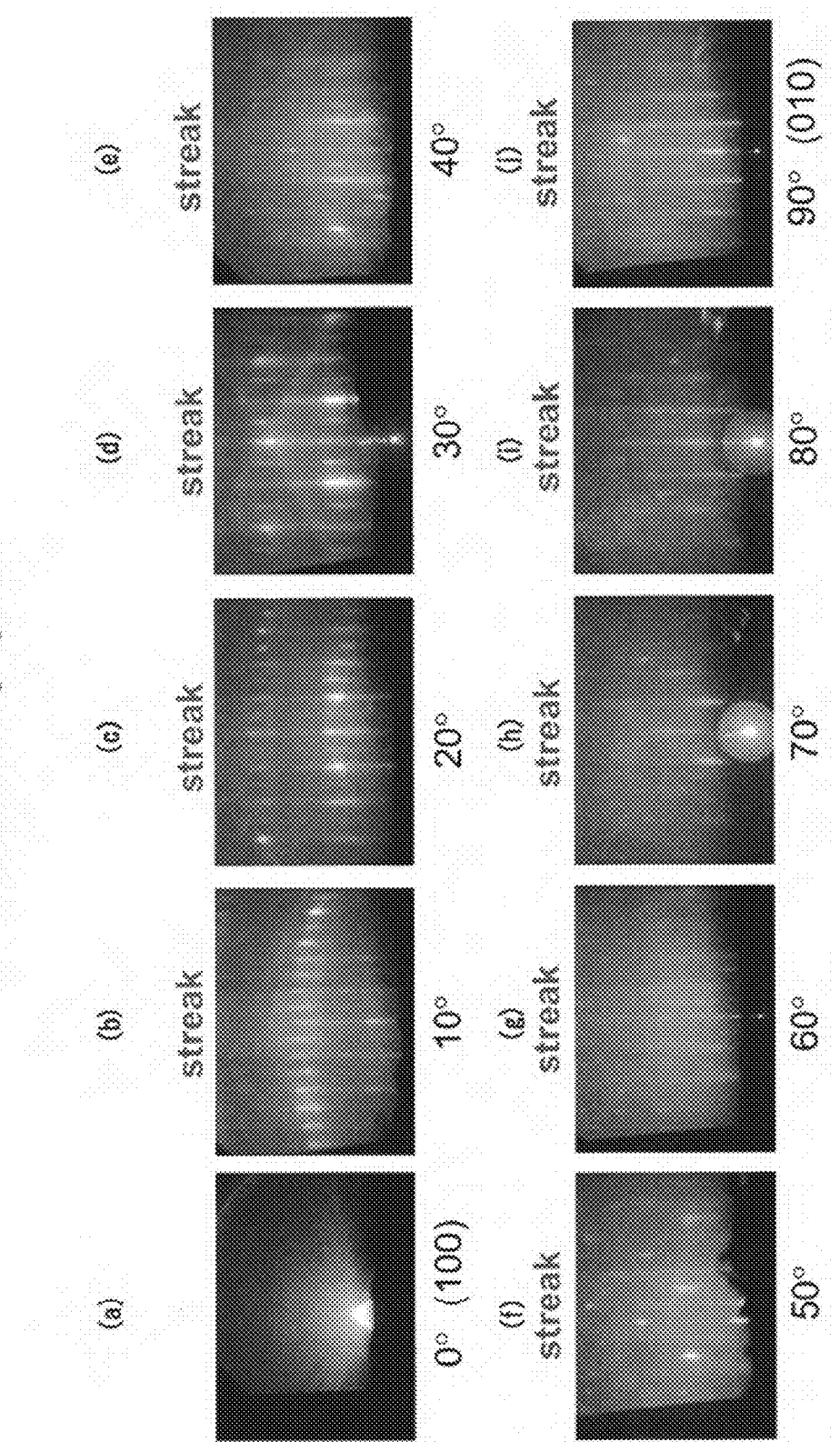
FIG. 10 is RHEED images from surfaces of epitaxial films grown on principal surfaces of $Ga_2O_3$ single crystal substrates which are planes rotated about [001] axis (Embodiment 3).

FIG. 10 is RHEED images from surfaces of the $Ga_2O_3$ crystal films grown on [001]-axis rotation planes.

As obvious from FIG. 10, the $Ga_2O_3$ crystal films grown on the planes rotated 10° to 90° about [001] axis all have a streaky pattern in the RHEED images. This shows that $Ga_2O_3$ single crystal films without mixture of a crystal with a different orientation from the substrate are obtained.

Such mixture of the crystal with a different orientation from the substrate is known to be caused by a stacking fault during epitaxial growth.

Although the $Ga_2O_3$ single crystal substrate was evaluated in Embodiment 3, similar evaluation results to the above are also obtained from evaluation of $Ga_2O_3$-based single crystal substrates other than the $Ga_2O_3$ single crystal substrate. In addition, similar evaluation results are obtained also when $(Ga_xIn_yAl_z)_2O_3$ crystal films ($0<x\leq1$, $0\leq y<1$, $0\leq z<1$, $x+y+z=1$) are grown in place of the $Ga_2O_3$ crystal film.

It is obvious from the above description that the following $Ga_2O_3$-based single crystal substrates and the method of growing a $Ga_2O_3$-based single crystal film are obtained.

A $Ga_2O_3$-based single crystal substrate, including as a growth face a plane rotated 10° to 40°, 76.3°, 90° to 110° or 150° from a (100) plane a [010] axis where a direction of rotation from the (100) plane to a (001) plane via a (101) plane is defined as positive.

A $Ga_2O_3$-based single crystal substrate, including as a growth face a plane rotated 10° to 90° from a (100) plane about a [001] axis.

A method of growing a $Ga_2O_3$-based single crystal film, including a step in which a $Ga_2O_3$-based crystal film is formed by epitaxially growing a $Ga_2O_3$-based crystal on a principal surface of a $Ga_2O_3$-based single crystal substrate, wherein the principal surface is a plane rotated 10° to 40° 76.3°, 90° to 110° or 150° from a (100) plane about a [010] axis where a direction of rotation from the (100) plane to a (001) plane via a (101) plane is defined as positive.

A method of growing a $Ga_2O_3$-based single crystal film, including a step in which a $Ga_2O_3$-based crystal film is formed by epitaxially growing a $Ga_2O_3$-based crystal on a principal surface of a $Ga_2O_3$-based single crystal substrate, wherein the principal surface is a plane rotated 10° to 90° from a (100) plane about a [001] axis.

Effects of Embodiment 3

In Embodiment 3, a $Ga_2O_3$-based crystal film not containing a crystal with a different orientation from the substrate can be grown on a principal surface of the $Ga_2O_3$-based single crystal substrate, allowing a leakage current in the device to be reduced.

Embodiment 4

A relation between surface flatness of crystal film and plane orientation, when forming a $Ga_2O_3$ crystal film on a $Ga_2O_3$-based single crystal substrate, was not revealed. When, for example, an electrode is formed on a rough surface of a crystal film to make a transistor, an electric field at an interface between the electrode and the $Ga_2O_3$ crystal film may vary, causing a decrease in withstand voltage of the device. Therefore, the crystal film with higher surface flatness is more preferable.

Therefore, aiming to obtain a $Ga_2O_3$-based single crystal substrate allowing a $Ga_2O_3$ crystal film grown on the principal surface to have high flatness, $Ga_2O_3$ crystal films were respectively grown on plural $Ga_2O_3$ single crystal substrates having principal surfaces with different plane orientations in Embodiment 4 to evaluate a relation between the plane orientation of the principal surface and flatness of the $Ga_2O_3$ crystal film.

(Manufacturing of $Ga_2O_3$ Single Crystal Substrate and $Ga_2O_3$ Crystal Film)

$Ga_2O_3$ single crystal substrates having principal surfaces being planes rotated 0 to 150° from the (100) plane about the [010] axis and $Ga_2O_3$ single crystal substrates having principal surfaces being planes rotated 10 to 90° from the (100) plane about the [001] axis were prepared, where the direction of rotation from the (100) plane to the (001) plane via the (101) plane gives positive angular values. The $Ga_2O_3$ single crystal substrates are doped with Sn and are n-type $Ga_2O_3$ single crystal substrates.

The surfaces of the $Ga_2O_3$ single crystal substrates were treated by a grinding/polishing process and the CMP process was performed after the grinding/polishing process. After the CMP process, the substrates were subjected to organic cleaning using an organic solvent (acetone, methanol, IPA, ethanol), immersion cleaning using HF and immersion cleaning using an acid obtained by mixing $H_2SO_4$, $H_2O_2$ and $H_2O$ at 4:1:1, were rinsed with ultrapure water, were then dried by blowing nitrogen, and were thereby brought into a substrate condition allowing for epitaxial growth. $Ga_2O_3$ crystal films were epitaxially grown on these substrates by MBE. The growth temperature was 750° C. and the growth time was 30 minutes. The thickness of the $Ga_2O_3$ crystal film was about 300 nm.

(Flatness of $Ga_2O_3$ Crystal Film)

Figure 11:
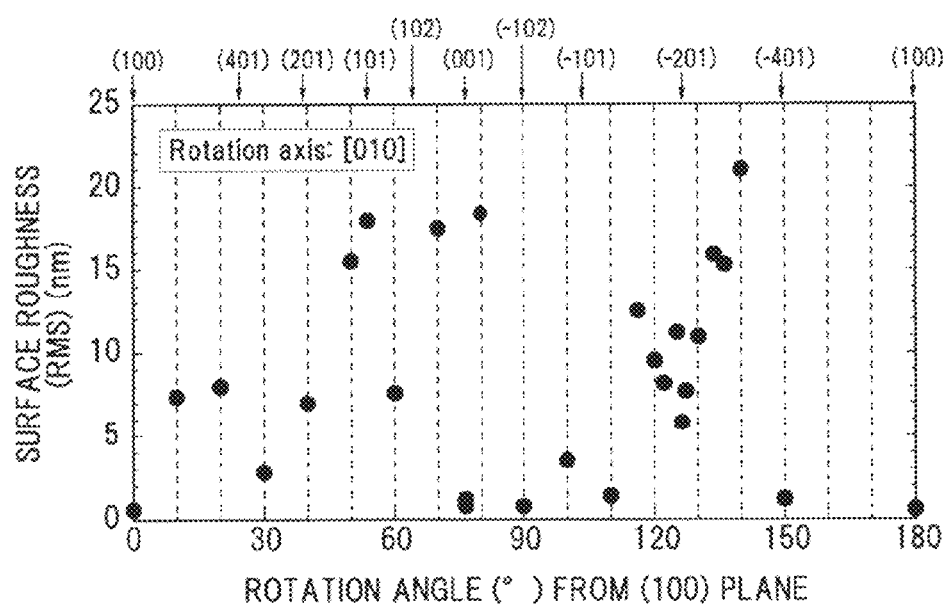
FIG. 11 is a diagram illustrating a relation between a rotation angle of principal surface of $Ga_2O_3$ single crystal substrate from the (100) plane about the [010] axis and surface roughness (RMS) of an epitaxial film grown on a principal surface of each substrate (Embodiment 4).

FIG. 11 is a diagram illustrating a relation between a rotation angle (°) of $Ga_2O_3$ single crystal substrate from the (100) plane about the [010] axis and surface roughness (RMS) (nm) of an epitaxial film grown on a principal surface of each substrate. The surface roughness (RMS) was estimated from the 5 μm×5 μm AFM images taken from surfaces of the $Ga_2O_3$ crystal films.

As obvious from FIG. 11, the $Ga_2O_3$ crystal films grown on the planes rotated 30°, 76.3°, 90° to 110° and 150° from the (100) plane about [010] axis tend to have a significantly low surface roughness.

Figure 12:
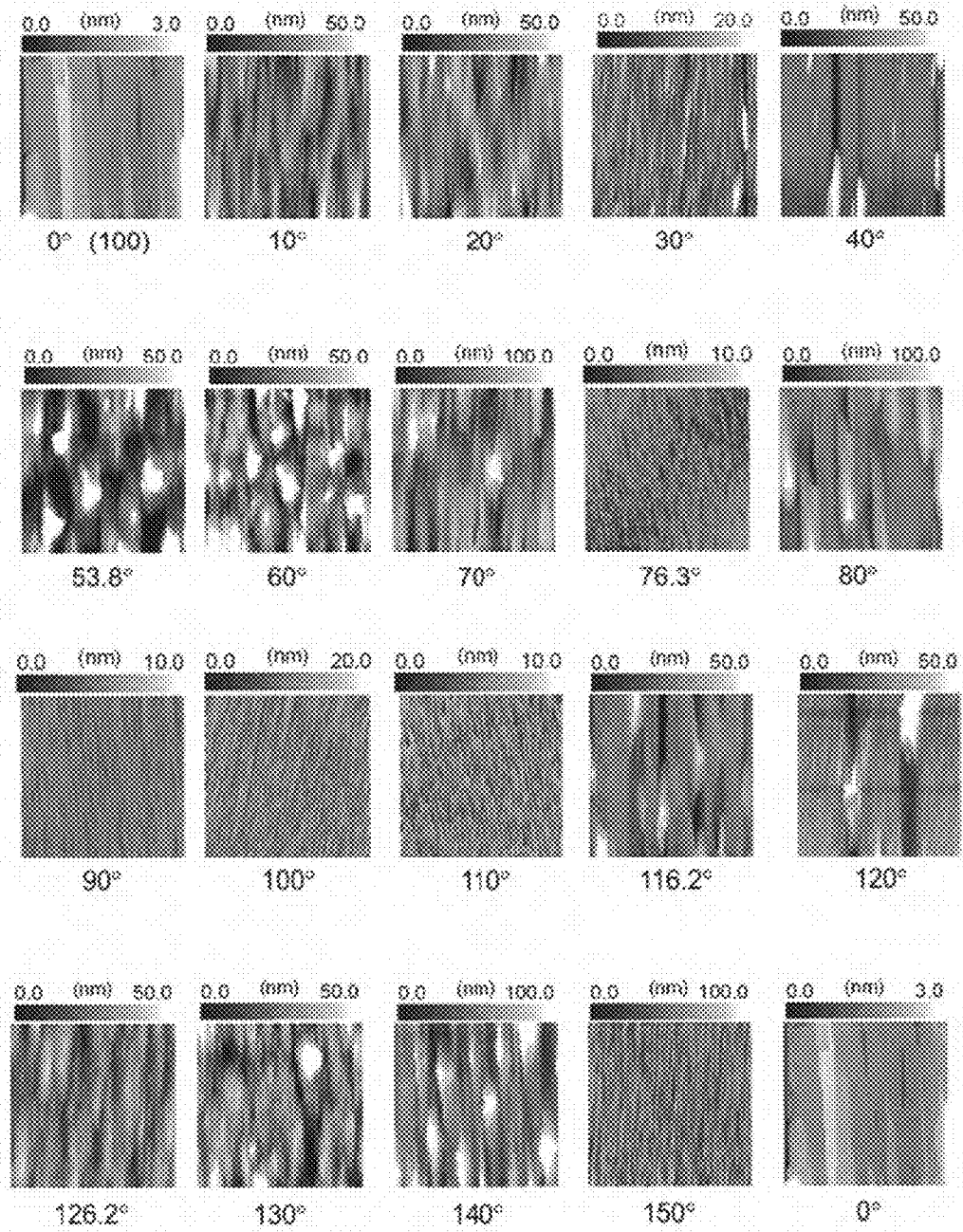
FIG. 12 is 5 μm×5 μm AFM images taken from surfaces of epitaxial films grown on principal surfaces of $Ga_2O_3$ single crystal substrates which are planes rotated about [010] axis (Embodiment 4).

FIG. 12 is 5 μm×5 μm AFM images taken from surfaces of epitaxial films grown on surfaces of $Ga_2O_3$ single crystal substrates which are planes rotated about [010] axis.

As obvious from FIG. 12, clear atomic steps are observed on the $Ga_2O_3$ crystal films grown on the planes rotated 30°, 76.3°, 90° to 110° and 150° from the (100) plane about [010] axis and it is considered that the films are formed by step-flow growth.

Figure 13:
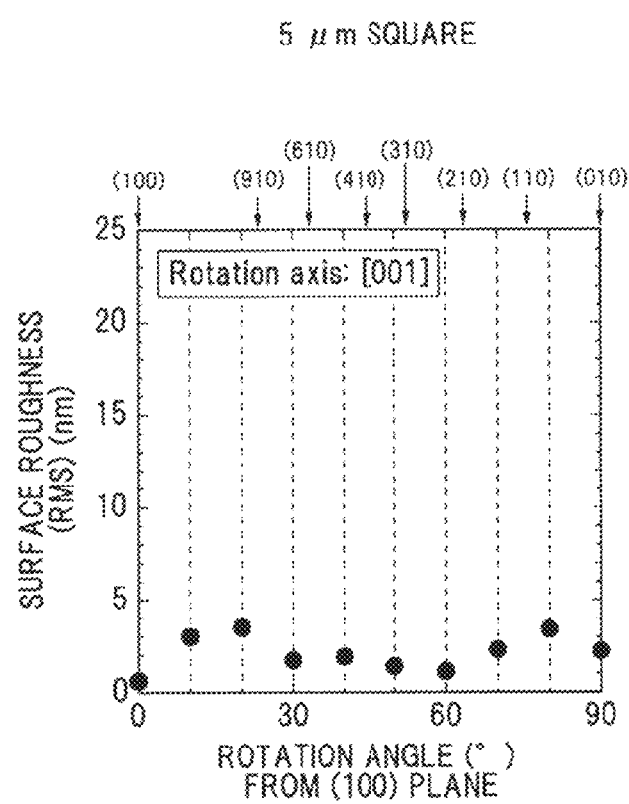
FIG. 13 is a diagram illustrating surface roughness (RMS) estimated from the 5 μm×5 μm AFM images taken from surfaces of epitaxial films grown on principal surfaces of $Ga_2O_3$ single crystal substrates which are planes rotated about [001] axis (Embodiment 4).

FIG. 13 shows surface roughness (RMS) estimated from the 5 μm×5 μm AFM images taken from surfaces of epitaxial films grown on surfaces of $Ga_2O_3$ single crystal substrates which are planes rotated about [001] axis.

As obvious from FIG. 13, the $Ga_2O_3$ crystal films grown on the planes rotated 10° to 90° about [001] axis are flat at any rotation angle in this range.

Figure 14:
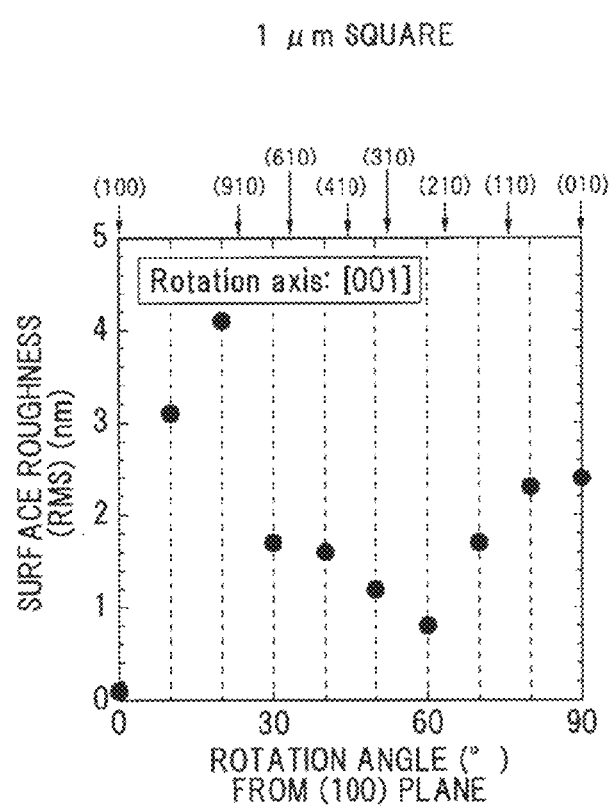
FIG. 14 is a diagram illustrating surface roughness (RMS) estimated from the 1 μm×1 μm AFM images taken from surfaces of epitaxial films grown on principal surfaces of $Ga_2O_3$ single crystal substrates which are planes rotated about [001] axis (Embodiment 4).

FIG. 14 shows surface roughness (RMS) estimated from the 1 μm×1 μm AFM images taken from surfaces of epitaxial films grown on surfaces of $Ga_2O_3$ single crystal substrates which are planes rotated about [001] axis.

As obvious from FIG. 14, the $Ga_2O_3$ crystal films grown on the planes rotated 10° to 90° about [001] axis are flat at any rotation angle in this range. Among the obtained flat $Ga_2O_3$ crystal films, flatness is especially high when grown on the planes rotated by around 60°.

FIG. 15 is 1 μm×1 μm AFM images taken from surfaces of epitaxial films grown on surfaces of the $Ga_2O_3$ single crystal substrates which are planes rotated about [001] axis.

As obvious from FIG. 15, a two-dimensionally grown crystal with flat surface was observed at around 60°. It was observed that step bunching becomes larger and the surface rougher with increase in difference from around 60°.

Although the $Ga_2O_3$ single crystal substrate was evaluated in Embodiment 4, similar evaluation results to the above are also obtained from evaluation of $Ga_2O_3$-based single crystal substrates other than the $Ga_2O_3$ single crystal substrate. In addition, similar evaluation results are obtained also when $(Ga_xIn_yAl_z)_2O_3$ crystal films ($0<x\le1$, $0\le y<1$, $0\le z<1$, x+y+z=1) are grown in place of the $Ga_2O_3$ crystal film.

It is obvious from the above description that the following $Ga_2O_3$-based single crystal substrates and the method of growing a $Ga_2O_3$-based single crystal film are obtained.

A $Ga_2O_3$-based single crystal substrate, including as a growth face a plane rotated 30°, 76.3°, 90° to 110° or 150° from a (100) plane about a [010] axis where a direction of rotation from the (100) plane to a (001) plane via a (101) plane is defined as positive.

A $Ga_2O_3$-based single crystal substrate, including as a growth face a plane rotated 10° to 90° from a (100) plane about a [001] axis.

A method of growing a $Ga_2O_3$ single crystal film, including a step in which a β-$Ga_2O_3$-based crystal film is formed by epitaxially growing a β-$Ga_2O_3$-based crystal on a principal surface of a $Ga_2O_3$-based single crystal substrate, wherein the principal surface is a plane rotated 30°, 76.3°, 90° to 110° or 150° from a (100) plane about a [010] axis where a direction of rotation from the (100) plane to a (001) plane via a (101) plane is defined as positive.

A method of growing a $Ga_2O_3$ single crystal film, including a step in which a β-$Ga_2O_3$-based crystal film is formed epitaxially growing β-$Ga_2O_3$-based crystal on a principal surface of a $Ga_2O_3$-based single crystal substrate, wherein the principal surface is a plane rotated 10° to 90° from a (100) plane about a [001] axis.

Effects of Embodiment 4

In Embodiment 4, the same effects as Embodiment 3 are obtained and it is also possible to obtain a highly flat $Ga_2O_3$ crystal film and thus to suppress a decrease in withstand voltage of the device.

Other Embodiments

Although some typical configuration examples of the $Ga_2O_3$-based single crystal substrate in the invention have been described in Embodiments and illustrated examples, it is possible to implement other Embodiments described below.

As obvious from the illustrated examples, in epitaxially growing a $Ga_2O_3$-based crystal film on a $Ga_2O_3$-based single crystal substrate, $Ga_2O_3$-based single crystal substrates having a (401) plane, a (201) plane, a (-102) plane, a (-101) plane, a (-401) plane or a (201) plane etc. as a principal surface may be also used. These $Ga_2O_3$-based single crystal substrates can be also used as low-polishing-crack-density $Ga_2O_3$-based single crystal substrates for high-rate growth of highly flat $Ga_2O_3$-based crystal films. When the $Ga_2O_3$-based crystal films grown on the $Ga_2O_3$-based single crystal substrates having such planes as mains surfaces are used to form devices, a leakage current does not increase since any non-monocrystalline portion is not formed, an electric field at an interface between the electrode and the $Ga_2O_3$ crystal film is uniform since the surface of the crystal film is highly flat, and it is thus possible to suppress a decrease in withstand voltage of the device.

In each Embodiment, even when a rotation angle about a direction perpendicular to the direction in the surface of the substrate is shifted, a rotation angle range of principal surface of $Ga_2O_3$-based single crystal substrate from the (100) plane about the about [010] axis to obtain the effects is substantially not affected as long as the angle shift is within about ±5°.

In each Embodiment, even when a rotation angle about a direction perpendicular to the direction in the surface of the substrate is shifted, a rotation angle range of the principal surface from the (100) plane about the about [001] axis to obtain the effects is substantially not affected as long as the angle shift is within about ±5°.

Although the typical Embodiments and illustrated examples of the invention have been described, the invention according to claims is not intended to be limited to the Embodiments and illustrated examples, as obvious from the above description. Therefore, it should be noted that all combinations of the features described in the Embodiments and illustrated example are not necessary to solve the problem of the invention.

INDUSTRIAL APPLICABILITY

A $Ga_2O_3$-based single crystal substrate which has a high processing yield can be provided.

The invention claimed is:

1. A method of providing a $Ga_2O_3$-based single crystal substrate having cracks at a crack density of less than 0.05 cracks/cm, comprising the steps of:
preparing a $Ga_2O_3$-based single crystal substrate, wherein a plane as a principal surface is rotated 10 to 150° about [010] axis with respect to a (100) plane, and wherein a direction of rotation from the (100) plane to a (001) plane via a (101) plane is defined as positive;
polishing the plane rotated an angle in a scope of 10 to 150° by using diamond abrasive grains; and
subsequently polishing the plane rotated the angle in the scope of 10 to 150° by CMP (Chemical Mechanical Planarization) process;
wherein the cracks are such cracks that occurred extending along a [010] direction on the plane due to polishing using the diamond abrasive grains, and were not eliminated by the CMP process.

2. A method of providing a $Ga_2O_3$-based single crystal substrate having cracks at a crack density of less than 0.05 cracks/cm and no latent scratch, comprising the steps of:
preparing a $Ga_2O_3$-based single crystal substrate, wherein a plane as a principal surface is rotated 10 to 70° or 100 to 150° about [010] axis with respect to a (100) plane, and wherein a direction of rotation from the (100) plane to a (001) plane via a (101) plane is defined as positive;
polishing the plane rotated an angle in a scope of 10 to 70° or 100 to 150° by using diamond abrasive grains; and
subsequently polishing the plane rotated the angle in the scope of 10 to 70° or 100 to 150° by CMP (Chemical Mechanical Planarization) process;
wherein the cracks are such cracks that occurred extending along a [010] direction on the plane due to polishing using the diamond abrasive grains, and were not eliminated by the CMP process.

\* \* \* \* \*